(12) United States Patent
Guilherme et al.

(10) Patent No.: US 7,733,171 B2
(45) Date of Patent: Jun. 8, 2010

(54) CLASS D AMPLIFIER HAVING PWM CIRCUIT WITH LOOK-UP TABLE

(75) Inventors: David Filipe Correia Guilherme, Agualva Cacém (PT); Jorge Miguel Alves Silva Duarte, Porto (PT)

(73) Assignee: Synopsys, Inc., Mountain View, CA (US)

( * ) Notice: Subject to any disclaimer, the term of this patent is extended or adjusted under 35 U.S.C. 154(b) by 186 days.

(21) Appl. No.: 11/968,101

(22) Filed: Dec. 31, 2007

(65) Prior Publication Data

US 2009/0167431 A1   Jul. 2, 2009

(51) Int. Cl.
  *H03F 3/38* (2006.01)
(52) U.S. Cl. .................. 330/10; 330/251; 330/207 A
(58) Field of Classification Search .............. 330/10, 330/251, 207 A
See application file for complete search history.

(56) References Cited

U.S. PATENT DOCUMENTS

| 5,617,058 A | * | 4/1997 | Adrian et al. ............... 330/10 |
| 6,992,610 B2 | * | 1/2006 | Komarura .................. 341/152 |

* cited by examiner

*Primary Examiner*—Patricia Nguyen
(74) *Attorney, Agent, or Firm*—Bever, Hoffman & Harms, LLP; Jeanette S. Harms

(57) ABSTRACT

A class D amplifier includes a noise-shaping modulator, a pulse width modulator, and a pulse amplifier. The noise-shaping modulator receive a pulse code modulated (PCM) signal and produces an oversampled PCM signal. The pulse width modulator produce a pulse width modulated (PWM) signal from the oversampled PCM signal. The pulse amplifier amplifies the PWM signal to produce an amplified PWM signal. The PWM uses a lookup table to convert from PCM to PWM. A compensation circuit optimizes amplifier performance. An optional demodulator filter converts the amplified PWM signal to an analog signal. The amplifier is ideal for integrated audio applications.

20 Claims, 8 Drawing Sheets

CLASS D AMPLIFIER HAVING PWM CIRCUIT WITH LOOK-UP TABLE

BACKGROUND OF THE INVENTION

1. Field of the Invention

This invention relates generally to amplifiers and, more particularly, to a class D audio amplifier.

2. Background Art

Power-hungry linear amplifiers have long dominated the world of audio. But, as portable-electronics consumers demand smaller devices with longer battery life, designers are looking to replace conventional linear amplifiers with high-efficiency, fully-integrated devices. Although class AB amplifiers continue to dominate the world of audio, switch-mode amplifiers are gradually conquering the consumer market, as they provide a good balance between efficiency and distortion.

Integrated circuit technologies favor the implementation of switch-mode audio amplifiers. They also provide means of integrating complex circuits for digital signal processing and power management in a chip.

The power efficiency of the driver is dominated by the power stage, and analog amplifiers (e.g., class A, class B and class AB amplifiers) tend to be inefficient. In a switch-mode amplifier (i.e., class D amplifier), the power stage is feed with a modulated signal from a pulse width modulator (PWM). This greatly increases the efficiency of the power stage.

Audio power-amplifiers based on PWM techniques and class D output stages are well-known in the art as an alternative to conventional AB amplifiers. Such designs use analog signal processing to form the PWM signal by comparing the audio signal with a high frequency saw tooth or triangle signal that acts as a carrier signal.

The transistors in a traditional class AB amplifier operate in the linear region, acting as variable resistor network between the supply and the load with the voltage that is dropped across the transistors being lost as heat. In contrast, the output transistors of a class D amplifier switch from full OFF to full ON (saturated) and then back again, spending very little time in the intermediate linear region. This results in much lower power loss in the switching transistors of the class D amplifier. Ideally, the switches of the class D amplifier dissipate no heat energy with a theoretical efficiency of 100% as opposed to the class B amplifier which has a theoretical maximum efficiency of 78%.

The advantages of class D drivers include, therefore, a high efficiency and small dimensions due to reduced needs for heat sinking. Also, the transfer characteristics of class D drivers output stage is far less prone to change with temperature and process variation then a conventional open loop class AB stage that requires careful bias control and matching of complementary devices.

Many additional benefits arise when the class D amplifier it is used in an entirely digital signal processing chain to transform a digital pulse code modulated (PCM) signal into a PWM signal that directly drives the class D output stage. The resulting amplifier is a true digital power amplifier that acts as a digital to analog converter (DAC), can provide high output power, and does not rely on analog signal processing and amplification. The internal functions of such a switch-mode power DAC circuit include: converting the PCM input signal into a PWM signal; amplifying the pulse signal with a halffull Bridge of power transistors; and filtering the high frequency contents of the power-switched output signal to recover the baseband input signal by removing the carrier signal and respective switching components.

One simple low-pass filter demodulation process requires that the amplified pulse signal must have a baseband free of any distortion terms (harmonic and non-harmonic). A lot of effort have been taken to overcome the deficiencies of direct PCM to PWM conversion in order to minimize distortion terms in the baseband. The simplest conceptual architecture is impractical, requiring clock speed in order of GHz for an audio frequency amplifier. The incorporation of oversampling and noise-shaping techniques can reduce the clock speed down to several tens of MHz, but distortions due to the underlying modulation process are still problematic.

Another approach to reducing distortion is to modify or pre-process the input signal before it is applied to the modulator. The nature of pre-processing will define the spectral characteristics of the output PWM signal and its fidelity in band noise and distortion. There are reported results of direct PWM modulation with pre-processing that can simultaneous achieve high fidelity and high efficiency. Beyond the nature of pre-processing, there are also variations on the PWM modulation process. The main classes of direct PWM include natural PWM (NPWM), uniform sampling PWM (UPWM), linear approximated PWM (LPWM), polynomial approximated PWM (PNPWM), and weighted PWM (WPWM).

A further approach to pulse modulation, applies a sigma-delta modulator structure within a digital power amplifier strategy. Reported implementations use normal, synchronous modulators that require relatively high switching frequencies to obtain good fidelity but at the expense of power efficiency.

Moreover, despite good modulator designs, an open-loop output power stage will introduce significant distortion and noise. Any amplifier solution must take into account the fact that the power stage and demodulation filter are inherently analog. Their errors are difficult to predict and difficult to eliminate in the digital domain.

What is needed is a high quality PWM input signal that can reach 0 dBFS (decibels full scale) with a controlled and preferably fixed, carried frequency. The digital PWM modulators normally used for audio applications have distortion problems that can only be solved with complex pre-processing algorithms. The sigma-delta modulators have noise shaping capabilities but do not offer a fixed frequency output signal as is preferred for class D amplifiers. Also, only modulators with multi-bit outputs can reach 0 dBFS without stability and distortion issues, but a multi-bit signal is not suitable to feed a class D audio amplifier.

What is needed is a class D amplifier that overcomes these limitation of known class D amplifiers.

BRIEF SUMMARY OF THE INVENTION

A class D amplifier includes a noise-shaping modulator, a pulse width modulator, and a pulse amplifier. The noise-shaping modulator receive a pulse code modulated (PCM) signal and produces an oversampled PCM signal. The pulse width modulator produce a pulse width modulated (PWM) signal from the oversampled PCM signal. The pulse amplifier amplifies the PWM signal to produce an amplified PWM signal. The PWM uses a lookup table to convert from PCM to PWM. A compensation circuit optimizes amplifier performance. An optional demodulator filter converts the amplified PWM signal to an analog signal. The amplifier is ideal for integrated audio applications, for example.

The amplifier of the invention is a practical solution to the common problems of known class D amplifiers and provides increased performance (e.g., reduced total harmonic distortion (THD)) and increased efficiency (e.g., reduced power consumption). The invention achieves these advantages in an elegantly straightforward way that is area-effective and eliminates the need for complex pre-processing. This allows the amplifier of the application to be easily ported to diverse applications and technologies/processes.

These and other features and advantages of the invention are described in detail below with reference to the figures.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention. In the drawings, like reference numbers indicate identical or functionally similar elements. Additionally, the leftmost digit of a reference number identifies the drawing in which the reference number first appears.

DETAILED DESCRIPTION OF THE INVENTION

The following detailed description of the invention refers to the accompanying drawings that illustrate exemplary embodiments consistent with this invention. Other embodiments are possible, and modifications may be made to the embodiments within the spirit and scope of the present invention. Therefore, the following detailed description is not meant to limit the invention. Rather, the scope of the invention is defined by the appended claims.

It would be apparent to one of skill in the art that the present invention, as described below, may be implemented in many different embodiments of hardware, firmware, and/or software (e.g., hardware description language (HDL) such as Verilog). Any actual software and/or hardware described herein is provided by way of example to illustrated the structure and operation of the invention and it not intended to be limiting of the scope of the invention. Thus, the operation and behavior of the present invention will be described with the understanding that modifications and variations of the embodiments are possible, given the level of detail presented herein.

The invention is now described in an example embodiment of an audio amplifier (also called an "audio driver"). While the invention is particularly useful for audio frequency applications, it will be apparent to a person skilled in the art that the invention can be implemented in other amplifier applications.

Figure 1:
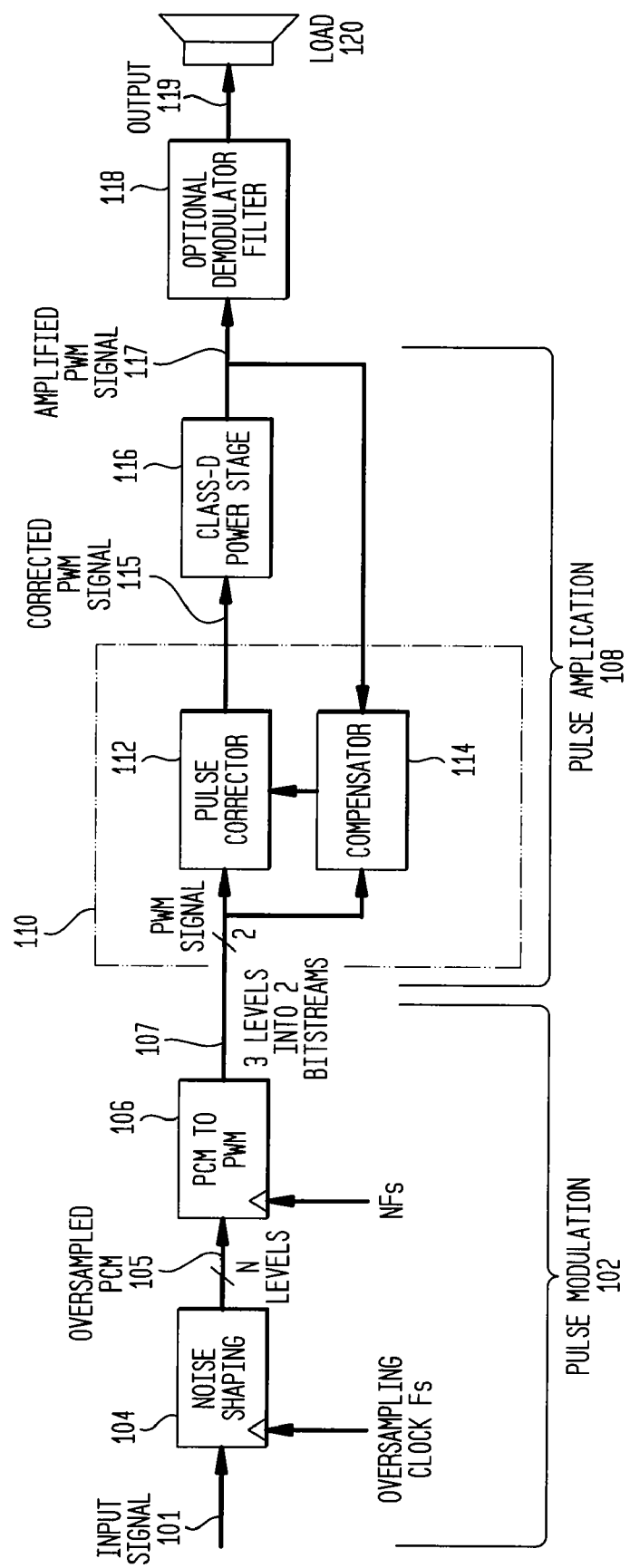
FIG. 1 is a block diagram of an example embodiment of the amplifier of the invention.

FIG. 1 shows an amplifier 100 constructed in accordance with an embodiment of the invention. In this example embodiment, amplifier 100 is configured as an audio driver. That is, amplifier 100 is configured to receive a pulse code modulated (PCM) signal 101. The PCM signal is an amplitude modulated digital signal representing, for example, an analog audio signal having frequencies in the range of about 20 hertz to about 20 KHz. Amplifier 100 amplifies this PCM signal and ultimately produces an amplified version of the original analog audio signal which is provided to a load such as a loudspeaker.

As shown in FIG. 1, amplifier 100 includes a pulse modulator 102, a pulse amplifier 108, and a demodulator filter 118. Pulse modulator 102 includes a noise-shaping modulator 104 and a pulse width modulator (PWM) 106. Pulse amplifier 108 includes a compensation circuit 110 and an amplifier power stage 116. Compensation circuit 110 includes a pulse corrector 112 and a compensator 114.

Noise shaping modulator 104 receives as an input PCM signal 101. Noise shaper 104 oversamples PCM signal 101 to produce an oversampled PCM signal 105. Oversampled PCM signal 105 is provided to PWM 106. PWM 106 converts oversampled PCM signal 105 to a PWM signal 107. PWM signal 107 includes a series of pulses having varying pulse widths rather than varying amplitudes as in PCM signal 101.

Compensation circuit 110 receives PWM signal 107 and uses closed-loop feedback to correct PWM signal 107 to produce a corrected PWM signal 115. Corrected PWM signal 115 is then provided to amplifier power stage 116 for amplification. Amplification power stage 116 produces an amplified PWM signal 117. The amplified PWM signal is still a digital PWM signal. This signal can be provided directly to a load such as a loudspeaker 120. The impedance of load 120 will act as a low pass filter that will convert the amplified PWM signal 117 to an analog audio signal as it is converted to audible sound waves. Alternatively, demodulator filter 118 can be used to convert amplified PWM signal 117 to an analog audio signal 119 for use by load 120. In this example embodiment, demodulator filter 118 is an LC low-pass filter.

In this example embodiment, PCM signal 101 is a 20-bit PCM signal. Noise shaping modulator 104 is clocked at an oversampling clock rate $F_S$ having a frequency 16 times the Nyquist frequency of PCM signal 101. Noise shaping modulator 104 produces an oversampled PCM signal 105 having 4 bits representing 16 levels. PWM 106 is clocked at a rate N times $F_S$ (or 16 times $F_S$, since in this example N=4 and $2^4$=16). Pulse width modulator 106 produces a PWM signal 107 having three levels (1, 0, or –1) being represented by one or two bits. PWM 106 also produces the inverse or complement of PWM signal 107. Both PWM signal 107 and its complement are provided to compensation circuit 110.

Figure 2:
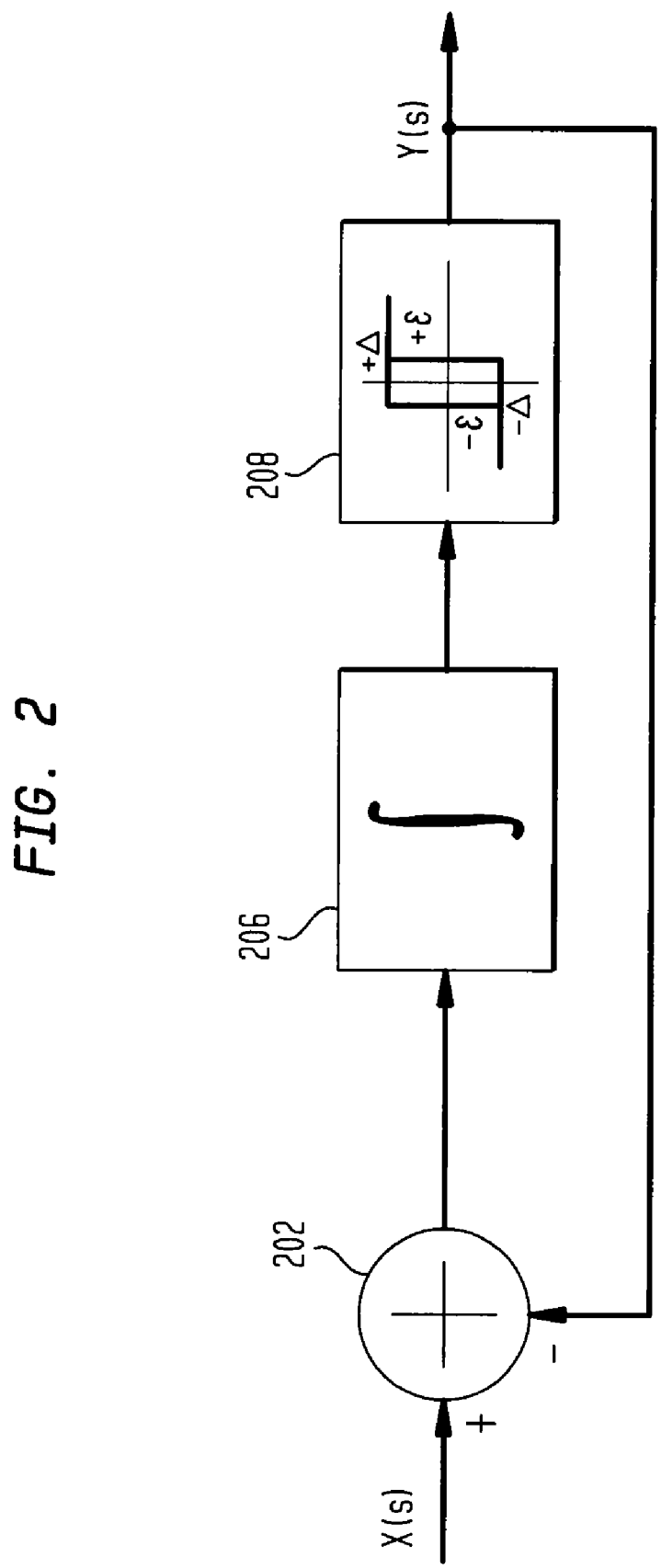
FIG. 2 is a block diagram of an example noise shaping modulator according to one embodiment of the invention.

FIG. 2 shows an example embodiment of noise shaping modulator (also called a "noise shaping filter") 104. In this example embodiment, noise shaping modulator 104 includes a summer 202, an integrator 206 and a comparator 208. Comparator 208 includes hysteresis and therefore may be called a "hysteretic comparator". In this example embodiment, noise shaping modulator 104 is a third-order sigma delta modulator. Sigma delta modulation, which is well known in the art, is particularly attractive for the present application due to its noise/shaping capability which will push quantization errors outside of the audio band where such errors can be more easily filtered. This improves signal-to-noise ratio (SNR) and total harmonic distortion (THD). While typical sigma delta modulators require higher switching frequencies that produce more power dissipation, the present embodiment implements a sigma delta modulator with a more limited switching frequency. Namely, a continuous time (asynchronous) sigma delta modulator implemented using hysteretic comparator 208. The memory characteristics of hysteretic comparator 208 cause it to commute only when necessary, implementing a kind of just-in-time paradigm. In addition, such an asynchronous sigma delta modulator is straight-forward to implement using mainstream CMOS technology.

Due to the realization in digital circuitry of the sigma delta modulator, it is easily portable between various manufacturing/process technologies. In this particular example, the digital-domain, pseudo-asynchronous sigma delta modulator operates at a clock rate of 32 MHz but with a reasonably low switching frequency of 500 KHz.

Figure 3:
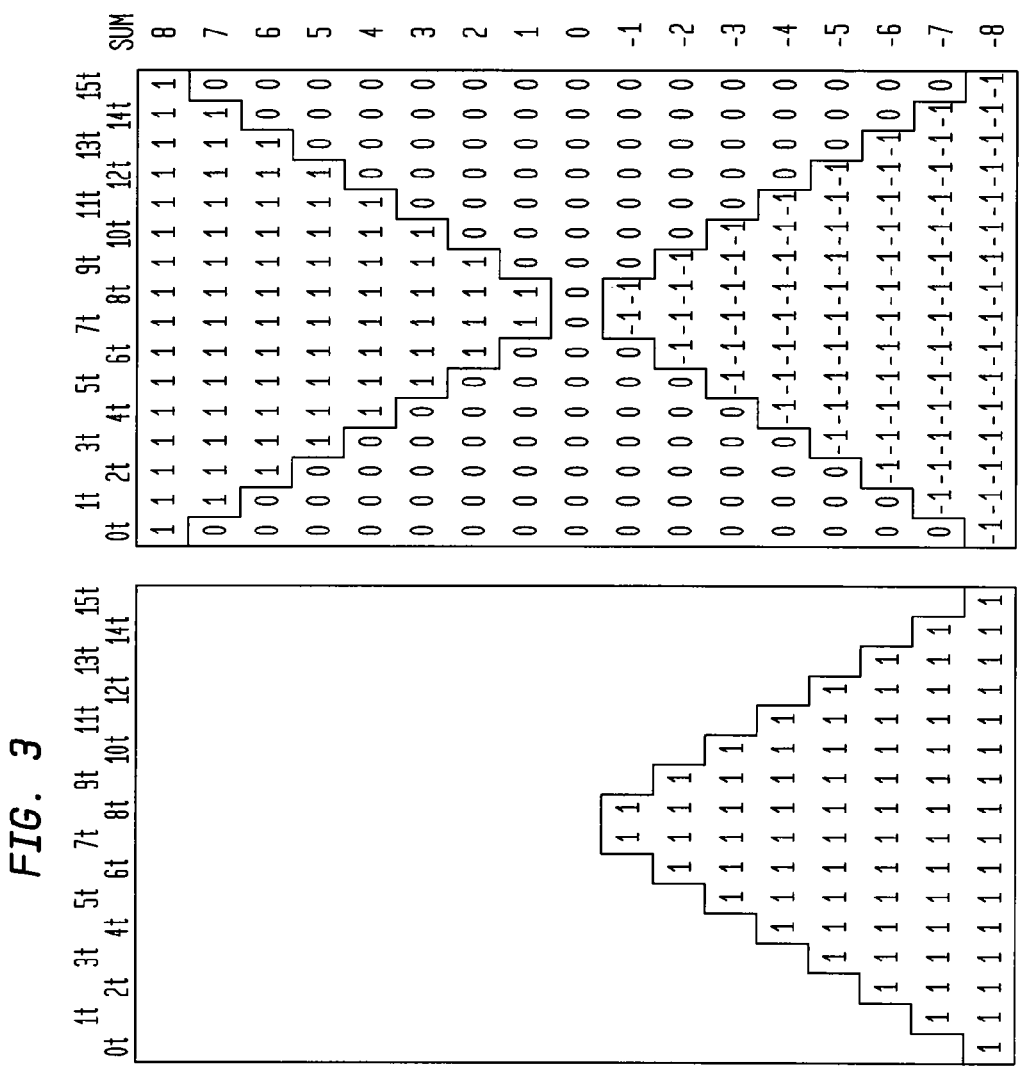
FIG. 3 shows an example contents and structure of a lookup table used for PCM to PWM conversion according to one embodiment of the invention.
Figure 3:
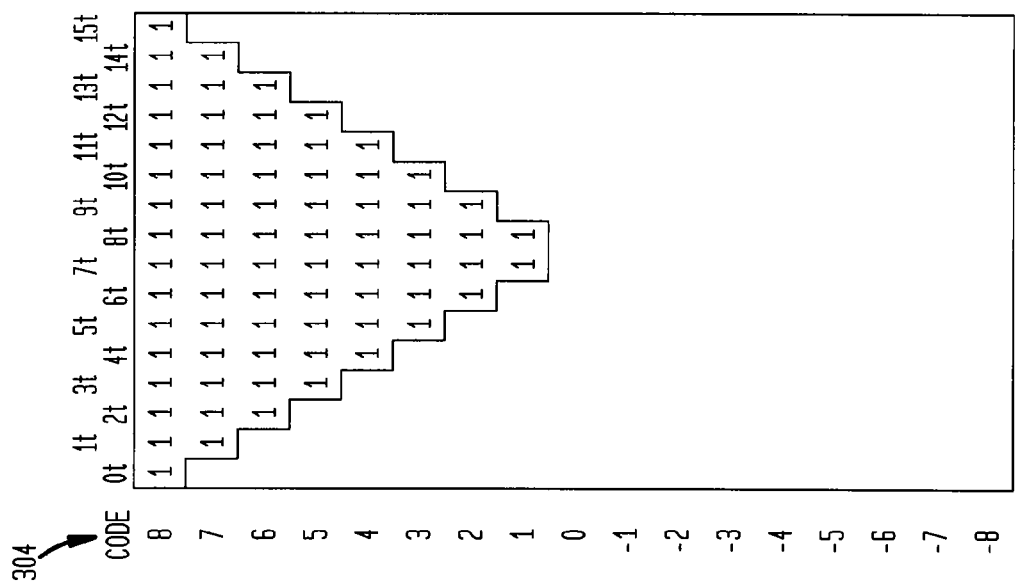

PWM 106 uses a look-up table to convert over-sampled PCM signal 105 to PWM signal 107. A sample lookup table 302 is shown in FIG. 3. In this example, the 4-bit oversampled PCM signal 105 received as input to PWM 106 can represent 16 different possible codes 304. That is, $2^4$ can represent 16 possible inputs to PWM 106. Table 302 maps each of these 16 inputs to a different pulse width. For example, a code of "5" maps to a pulse having a width of 12t−3t=9t, where t represents a unit of time. Note that table 302 is a 2-bit table (representing 3 levels: 1, 0 and −1). As described below, each bit will control a respective arm of the H-bridge of amplifier power stage 116. Thus, the lookup from table 302 will produce a PWM signal 107 having two separate bit streams; PWM signal 107 and its complement. Note that table 302 is symmetrical.

This lookup table implementation of PWM 106 provides an elegant solution to the PCM-to-PWM conversion. Known PWM modulators that are normally used in audio applications suffer from distortion problems that can only be solved with complex algorithms. The present invention provides high quality PCM-to-PWM conversion while avoiding the stability and dynamic range limitations of known solutions. It is also easily implemented in an integrated circuit with, for example, CMOS technology. When compared with complex algorithms implemented by conventional digital signal processing and digital circuit solutions, silicon area and power consumption are conserved.

Figure 4:
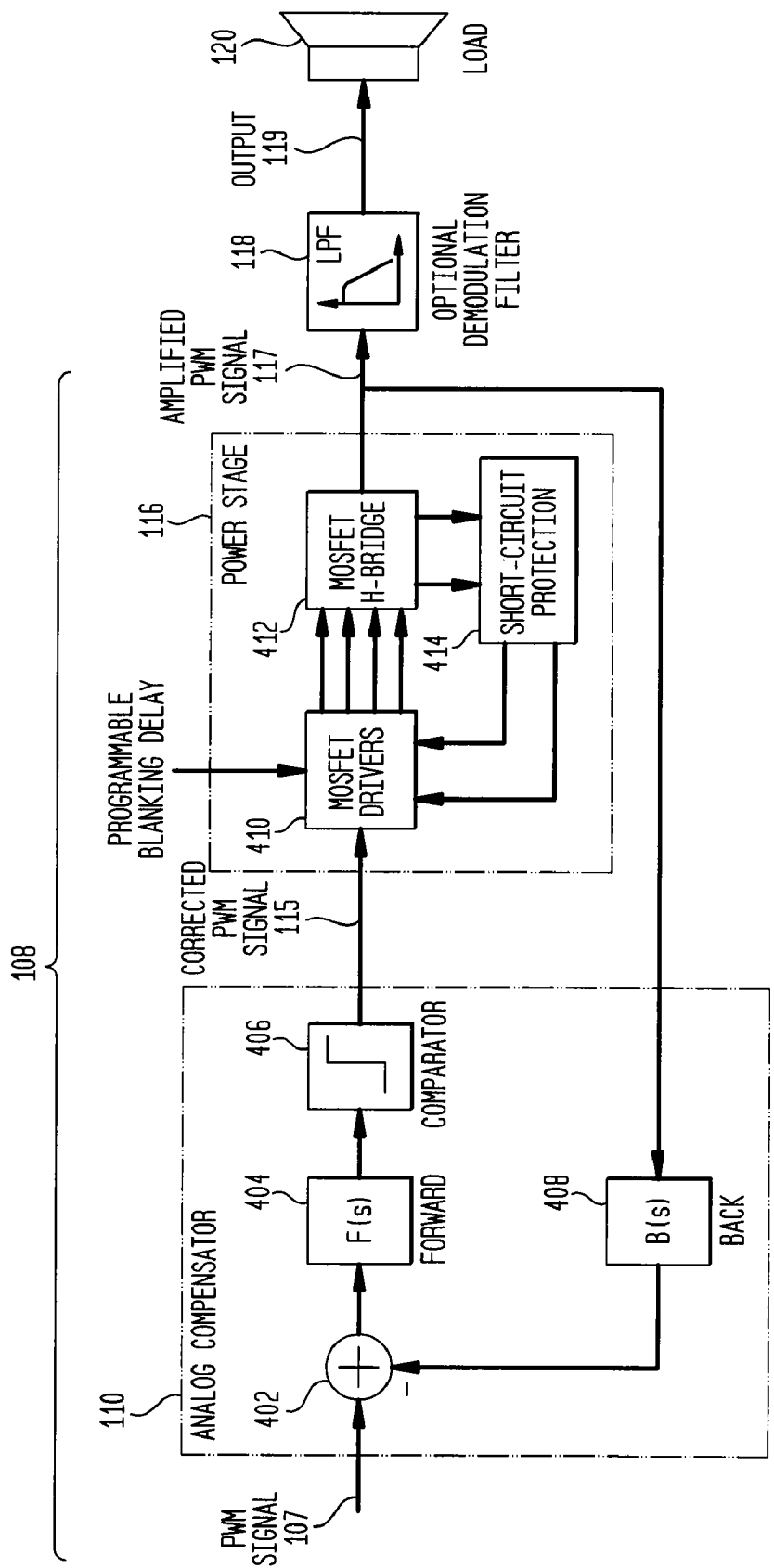
FIG. 4 is a block diagram of an example output stage of the amplifier of FIG. 1 according to one embodiment of the invention.

FIG. 4 shows pulse amplifier 108 in additional detail. As shown, compensation circuit 110 includes a summer 402, an integrator 404, a comparator 406 and an attenuator 408. Compensator circuit 110 corrects pulse errors through pulse retiming. Compensator circuit 110 evaluates the mean error between its input pulses and pulses output by power stage 116. This implementation is similar to a continuous-time, sigma delta modulator, but the oscillation frequency is determined by the PWM input signal.

Also as shown in FIG. 4, amplifier power stage 116 includes MOSFET drivers 410, MOSFET H-bridge 412 and short circuit protection circuit 414. MOSFET H-bridge 412 includes, for example, four MOSFET power transistors connected in a H-bridge configuration to provide the amplification of corrected PWM signal 115. MOSFET drivers 410 control the switching of the MOSFET transistors in H-bridge 412. Short circuit protection circuit 414 monitors the current through the MOSFET power transistors and, through a feedback loop, controls MOSFET drivers 410 to prevent an overcurrent condition in the event of, for example, a short circuit at the output.

Figure 5:
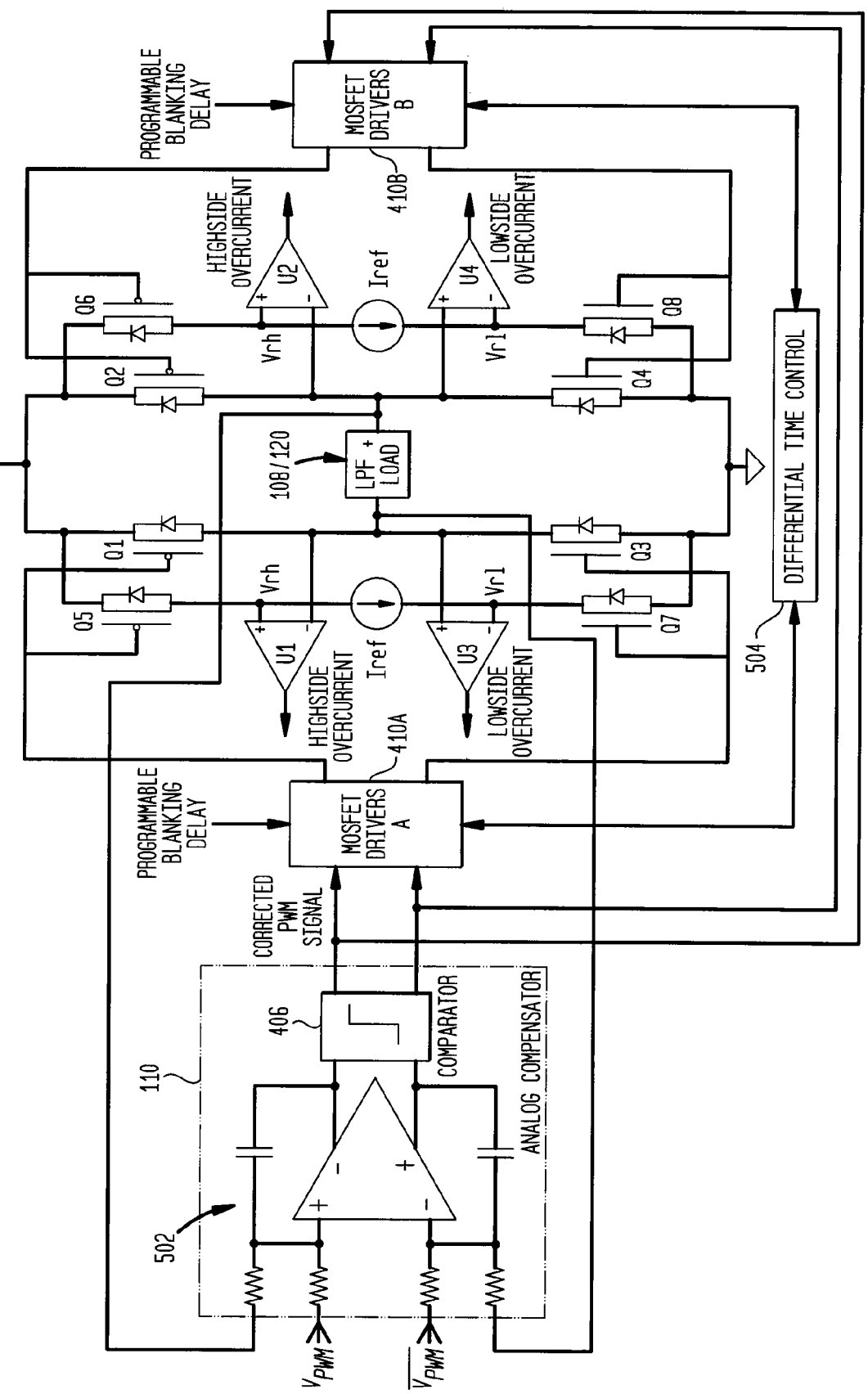
FIG. 5 is a more detailed block diagram of an example output stage of the amplifier of FIG. 1 according to one embodiment of the invention.

Pulse amplifier 108 is shown in still greater in FIG. 5. As shown, compensation circuit 110 is implemented using an integrating amplifier 502 and a comparator 406. PWM signal 107 and its complement are input to integrating amplifier 502, which also receives feedback of output signal 119. The differential outputs of integrating amplifier 502 are provided to comparator 406. As described above, the corrected PWM signal 115 is then provided to MOSFET drivers 410. As illustrated in FIG. 5, MOSFET drivers 410 are represented by MOSFET drivers 410a and 410b. MOSFET drivers 410a drive MOSFETs Q1 and Q3 in the H-bridge. MOSFET drivers 410b drive MOSFETs Q2 and Q4 in the H-bridge. Transistors (e.g., MOSFETs Q5-Q8) in connection with comparators U1-U4 provide overcurrent sensing as part of short circuit protection circuit 414. An optional differential timing control circuit 504 allows fine adjustment of timing between MOSFET drivers 410a and MOSFET drivers 410b.

Figure 6:
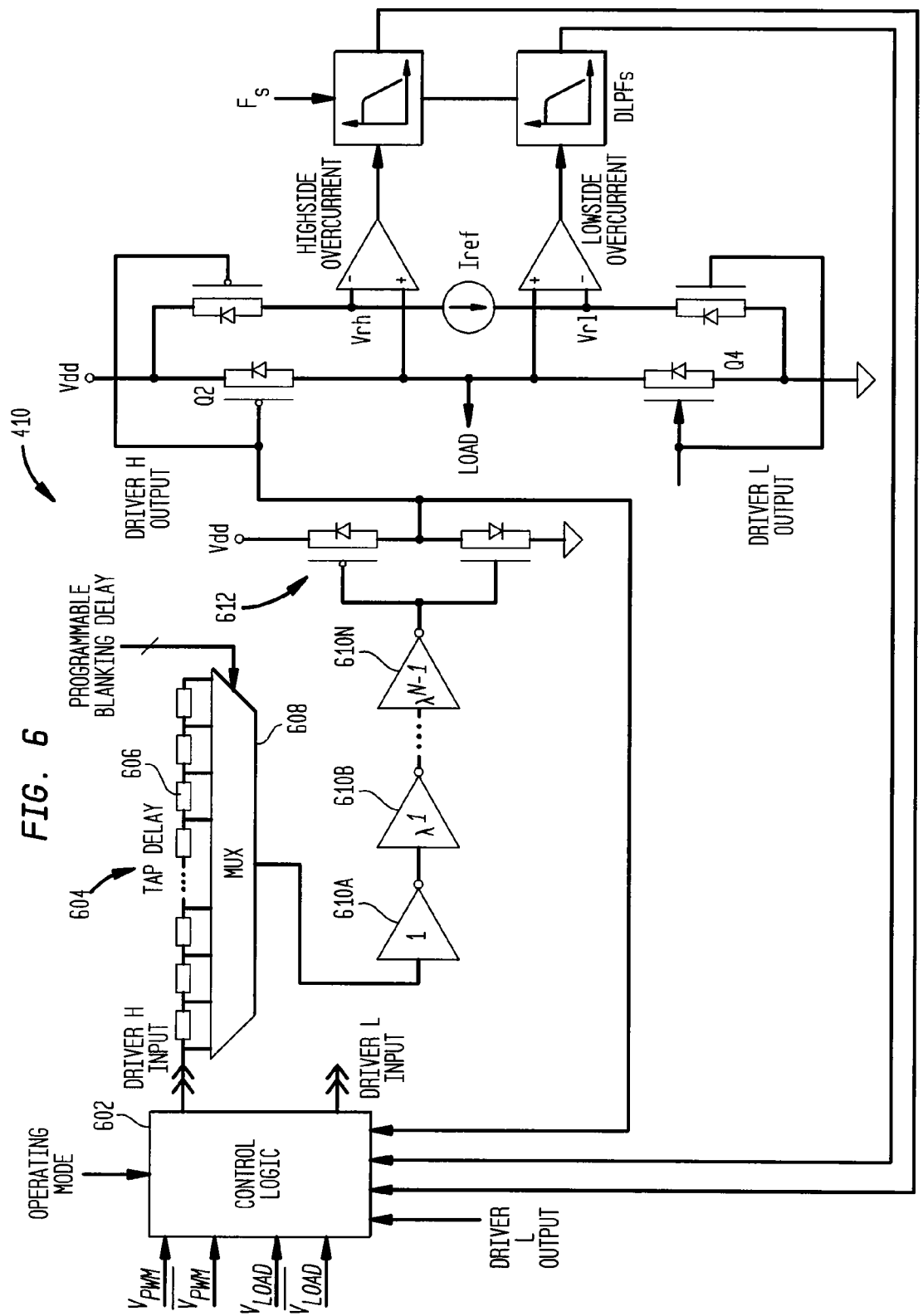
FIG. 6 is a block diagram illustrating a portion of a MOSFET driver and output stage of the amplifier of FIG. 1 according to one embodiment of the invention.

FIG. 6 illustrates a MOSFET driver 410 in communication with two transistors (e.g., Q2 and Q4) of the H-bridge. MOSFET driver 410 includes control logic 602, a delay line 604 having tapped delay elements 606, a multiplexer (MUX) 608, a plurality of inverters 610 and drive transistors 612. As illustrated, control logic 602 receives corrected PWM signal 115 as well as its complement. Control logic 602 also receives signals representing the load voltage, and overcurrent signals from the short circuit protection circuitry. From these inputs, control logic 602 controls the on and off switching of the power MOSFETs in the H-bridge. Delay line 604 is programmably controlled to allow the delay to be adjusted. Amplifier 100 uses this adjustable delay to optimize the power efficiency of the power MOSFETs Q1-Q4.

Figure 7:
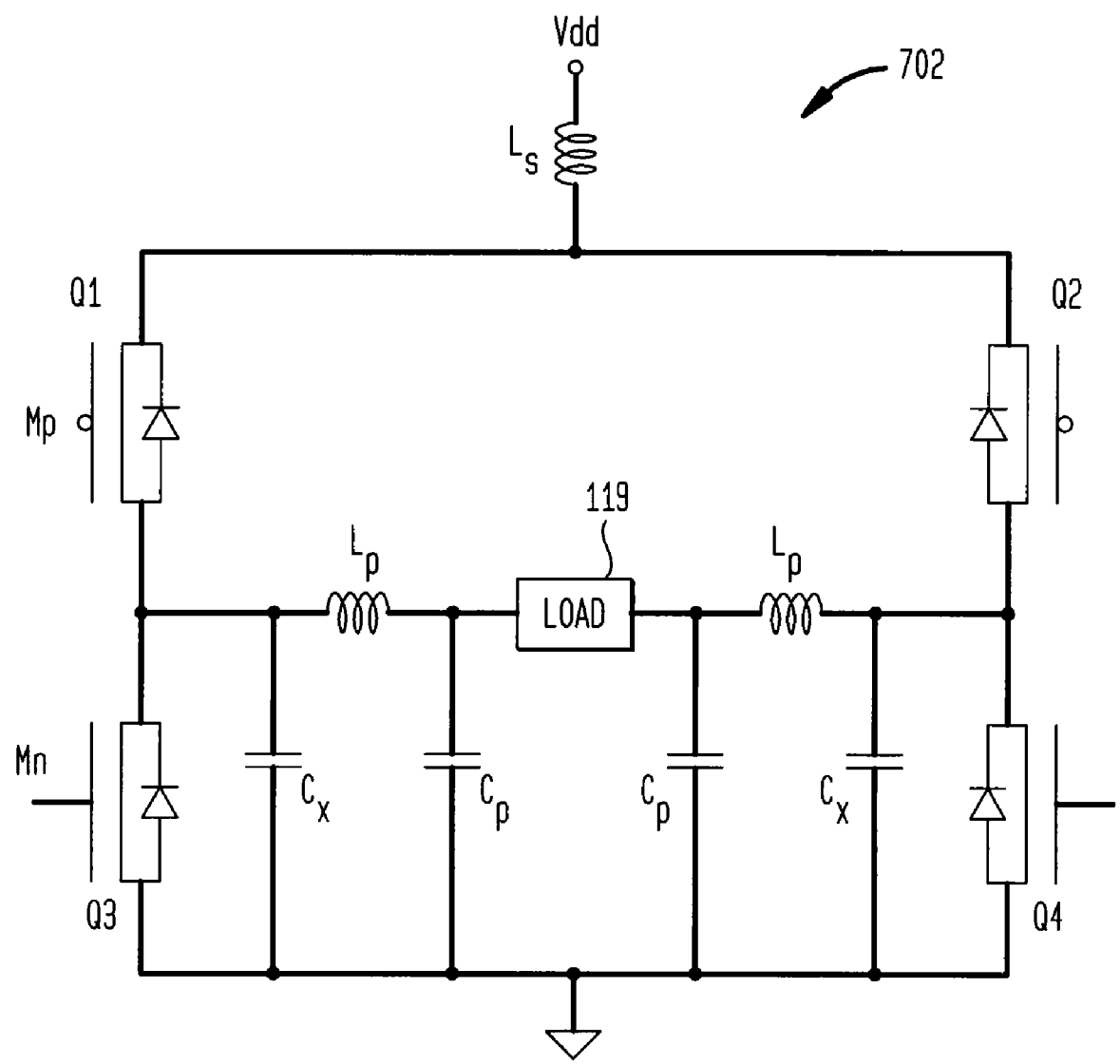
FIG. 7 is a schematic diagram illustrating the H-bridge portion, load, and parasitic impedances of the output stage of the amplifier of FIG. 1 according to one embodiment of the invention.

FIG. 7 shows the power MOSFETs Q1-Q4 connected in the H-bridge configuration to a load 119. Also shown are parasitic capacitances $C_X$ and $C_P$ and parasitic inductances $L_P$. For ease of reference in FIG. 7, this circuitry is referred to as power stage 702. Power stage 702 is responsible of the power conversion function, i.e. the function that involves the amplification of the PWM signal to a power or amplified PWM signal. MOSFETs Q1-Q4 are selected to have appropriate characteristics to support the supply voltage, output power and switching frequency requirements of the amplifier. The MOSFETs may be external or internal to an integrated circuit, depending on the process technology, voltage and output power requirements. Power stage 702 may also include a low-pass filter LC structure (not shown) for each H-bridge arm.

When current flows through non-ideal components like transistors, resistors, capacitors and interconnection networks, power losses (efficiency) and signal quality degradation (distortion) are inevitable. The power efficiency problem is a power dissipation problem with many sources, including, for example, conduction losses, gate drive losses (due to the gate capacitance in CMOS switches), stray inductive switching losses, no dead-time short circuit losses, dead-time too short capacitive switching losses, dead-time too-long body diode conduction losses, and control circuits operating power losses.

Conduction losses and gate losses are inevitable, but switching losses can be reduced with soft switching techniques. Soft switching involves smoothing the rising and falling edges of the switching waveforms to reduce transient spikes. This reduces switching losses, device stress and EMI. Passive snubber circuits and other techniques can be used to achieve soft switching.

Another way to reduce switching losses is to use dead-time control. Adaptive dead-time control can optimize simultaneously the power efficiency and signal fidelity.

Figure 8:
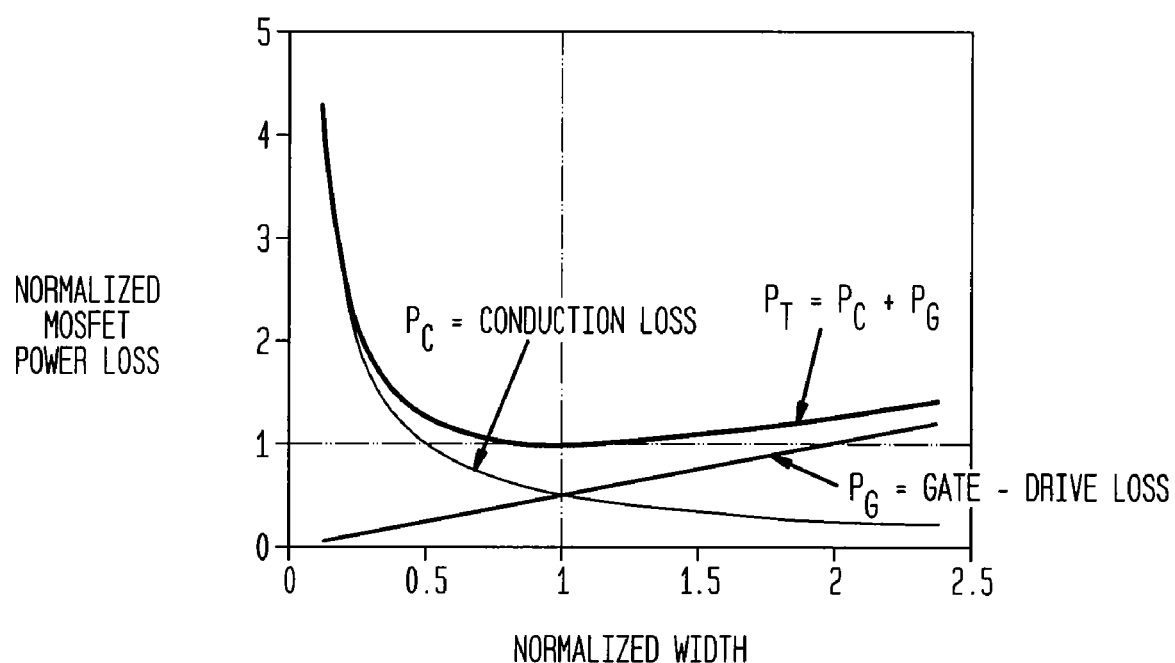
FIG. 8 is a graph illustrating normalized MOSFET power loss as a function of normalized MOSFET gate width.

Yet another way to reduce switching losses is to size power MOSFETs Q1-Q4 to an optimal value. When sizing a MOSFET for a specific application, the primary objective is to minimize the conduction and gate drive losses. FIG. 8 illustrates normalized power transistor losses as a function of gate width. In accordance with an embodiment of the present invention, the optimal gate width of the power MOSFETs is computed according to the following equation:

$$W_{opt} = \sqrt{\frac{3P_o}{2R_L K C_{ox} f_{sw} V_{gs}^2 (V_{gs} - V_t)}}$$

In an example embodiment, where:
Po (output power)=1 W,
RL (output load)=8Ω,
fsw (switching frequency)=500 kHz,
Vgs (supply voltage)=3.3 V,
Vt (threshold voltage)=0.7 V,
K (conduction factor)=100 μA/V2, and
Cox (gate-oxide capacitance)=5 fF/μ2;

the optimal MOSFET gate width, Wopt, is 5.150 μm. Calculations have shown that efficiencies above about 80% can be achieved if the switching frequency is kept below about 800 KHz.

It is highly desirable that the H-bridge generates a waveform that is close to a perfect square wave signal and is independent of the load current. A critical phase is during the switching of the H-bridge, i.e., when one set of switches is turned OFF and another set is turned ON. After the switching, the H-bridge operates in a far more well-defined state governed by the ON and OFF resistances of the switches. However, even during those states, amplitude perturbations induce distortion on the audio signal.

It is appropriate to divide the error sources in to pulse timing errors and pulse amplitude errors. Pulse Timing Errors arise from: turn-on delays $td_r$ and turn-off delays $td_f$, deadtime or blanking time td, and finite rise and fall times $t_r$ and $t_f$. Pulse amplitude errors Ve arise from: perturbations on the power supply, non-zero impedance of switches, non-zero impedance of the power supply, and high frequency resonant transients. Both errors degrade the amplifier fidelity. The present invention uses compensation circuit 110 (see FIG. 1) to reduce such distortions.

Turn-on and turn-off delays are inevitable, due to the non-ideal characteristics of driver circuits and power MOSFET gates. The distortion factor will be the difference between delays, and the multi-parameter dependency of those makes it difficult to estimate the differential time error and resulting distortion. However, the absolute delays can be reduced to below 10 ns and the differential delay reduced to insignificant levels without compromising other aspects. The approach to minimize delay distortion is to minimize driver impedance and optimize power MOSFET gate charging, such as to cancel the delays. Delay distortion is generally not a limiting factor in switching output stages, but will contribute to decreased fidelity. More important is the blanking delay or dead-time. It is necessary to have some finite blanking-time where no switches are ON in each of the two half-bridges. Otherwise, extreme transients of current are drawn from the power supply leading to potential destruction of the switches, increased power consumption and to high voltage spikes.

On the other hand, during the blanking period, the output voltage is not controlled by the switches and this generates harmonic distortion and increases the overall output impedance of the H-bridge. The influences of finite rise and fall-times will also contribute to noise and distortion. Contrary to blanking delay, however, when the transition time between ON and OFF states of the switches are too long, the power losses increases. This is because the instantaneous product of switch current and voltage accumulates more dissipated energy during each switching period. Although the effect is not dominating compared with other error sources, it must be accounted for.

Another source of distortion and noise is the oscillations that are potentially triggered by each switching cycle. The source of oscillations is interactions between the parasitic components of the H-bridge, i.e., stray inductances forming LC-tanks with the switch capacitance. The presence of such oscillations means that there is a nonlinear relationship between the integral of the pulse voltage and the pulse width. This distortion phenomenon is often dominating the other sources of distortion especially at higher amplitudes.

Another reason to avoid waveform oscillations is for end-product EMC (electromagnetic compatibility) requirements. A full-scale oscillation with a quality-factor of 10 produces 20 dB more radiation around the oscillation frequency as compared to a well-damped circuit. The best solution to control the problem is at its source, i.e., inside the H-bridge. Unfortunately, the use of very fast switching, short blanking time and very low ON state resistance that normally is desired for high efficiency, low output impedance and low distortion will also trigger more oscillations.

Another fundamental element that distorts the pulse amplitude is caused by the finite impedance of the power switches. The power MOSFET voltage/current characteristic when ON can be simplified to a resistor in parallel with a power diode. The finite switch impedance results in amplitude modulation. At higher output currents, the amplitude error will introduce both linear and nonlinear distortion.

Another kind of amplitude error is power supply and line impedance. This type of error source can have significant magnitude. The power supply in the class D amplifier equals the reference voltage of a standard D/A converter. Therefore, low noise and output impedance are crucial. There is a direct relationship between the amplifier distortion and the output impedance of the supply.

The design of the H-bridge can be a complex task of balancing and controlling many effects and parameters. Generally, better amplifier performance, i.e., low output impedance, noise and distortion, is obtained at the expense of lower power efficiency and reduced EMC (i.e., generation of greater electromagnetic interference). Thus, to meet the requirements of simultaneously high fidelity and high efficiency, it is necessary to limit the performance characteristics of the amplifier by implementing error compensation. Compensation circuit 110 provides such compensation by providing an analog continuous-time pulse compensator that corrects the timing of the pulses of the PWM signal. Compensation circuit 110 integrates and evaluates the error between the input and output pulses. This solution is similar to a continuous time sigma-delta modulator, but the oscillation frequency is determined by the PWM input signal, rather than some internal parameter. The first order structure ensures stability over the full operating range.

While various embodiments of the present invention have been described above, it should be understood that they have been presented by way of example, and not limitation. It will be apparent to persons skilled in the relevant arts that various changes in form and detail can be made therein without departing from the scope of the invention. For example, in addition to using hardware (e.g., within or coupled to a Central Processing Unit ("CPU"), microprocessor, microcontroller, digital signal processor, processor core, System on Chip ("SOC"), or any other device), implementations may also be embodied in software (e.g., computer readable code, program code and/or instructions disposed in any form, such as source, object or machine language) disposed, for example, in a computer usable (e.g., readable) medium configured to store the software. Such software can enable, for example, the function, fabrication, modeling, simulation, description and/or testing of the apparatus and methods described herein. For example, this can be accomplished through the use of general programming languages (e.g., C, C++), hardware description languages (HDL) including Verilog HDL, VHDL, SystemC Register Transfer Level (RTL), and so on, or other available programs. Such software can be disposed in any known computer usable medium such as semiconductor, magnetic disk, optical disk (e.g., CD-ROM, DVD-ROM, etc.). Embodiments of the present invention may include methods of providing an apparatus described herein by providing software describing the apparatus and subsequently transmitting the software as a computer data signal over a communication network including the Internet and intranets.

More specifically, it is understood that the apparatus and method embodiments described herein may be included in a semiconductor intellectual property core, (e.g., embodied in HDL) and transformed to hardware in the production of integrated circuits. Additionally, the apparatus and method embodiments described herein may be embodied as a combination of hardware and software. Thus, the present invention should not be limited by any of the above-described exemplary embodiments, but should be defined only in accordance with the following claims and their equivalence. Furthermore, it should be appreciated that the detailed description of the present invention provided herein, and not the summary and abstract sections, is intended to be used to interpret the claims.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:
1. An amplifier comprising:
  a noise-shaping modulator to receive a pulse code modulated (PCM) signal and to produce an oversampled PCM signal;
  a pulse width modulator to produce a pulse width modulated (PWM) signal from both the oversampled PCM signal and a lookup table referenced by the data in the PCM signal; and
  a pulse amplifier to amplify the PWM signal to produce an amplified PWM signal.

2. The amplifier of claim 1, further comprising:
  a demodulator filter to filter the amplified PWM signal to produce an output signal.

3. The amplifier of claim 1, wherein the noise-shaping modulator comprises a sigma delta modulator.

4. The amplifier of claim 1, wherein the noise-shaping modulator produces a four bit oversampled PCM signal and the pulse width modulator produces a PWM signal having no more than two bits per sample.

5. The amplifier of claim 4, wherein the noise-shaping modulator samples at a rate that is at least sixteen times greater than a Nyquist frequency of the PCM signal, and the pulse width modulator samples at a rate that is at least sixteen times greater than the sampling rate of the noise-shaping modulator.

6. The amplifier of claim 1, wherein the pulse amplifier comprises:
  a pulse corrector to filter the PWM signal;
  an amplifier power stage to amplify the filtered PWM signal; and
  a compensator to provide feedback to the pulse corrector based on the amplified PWM signal.

7. The amplifier of claim 6, wherein the pulse corrector comprises an analog compensator including a comparator.

8. The amplifier of claim 6, wherein the amplifier power stage comprises MOSFETs arranged in an H-bridge configuration.

9. The amplifier of claim 8, wherein the amplifier power stage further comprises programmable blanking delay circuitry.

10. The amplifier of claim 9, wherein the programmable blanking delay circuitry comprises a multi-tapped delay line.

11. The amplifier of claim 9, wherein the amplifier power stage further comprises short-circuit protection circuitry.

12. A class D audio amplifier comprising an amplifier power stage including MOSFETs arranged in an H-bridge configuration, wherein the gate width ($W_{opt}$) of each MOSFET is defined by:

$$W_{opt} = \sqrt{\frac{3P_o}{2R_L K C_{ox} f_{sw} V_{gs}^2 (V_{gs} - V_t)}}$$

wherein $P_o$ is output power, $R_L$ is output load, $f_{sw}$ is switching frequency, $V_{gs}$ is supply voltage, $V_t$ is threshold voltage, K is a conduction factor, and $C_{ox}$ is gate-oxide capacitance.

13. The class D audio amplifier of claim 12, wherein the gate width of each MOSFET is between about 5 μm and about 5.300 μm.

14. The class D audio amplifier of claim 13, wherein the gate width of each MOSFET is about 5.150 μm.

15. A class D audio driver comprising:
  means for converting a pulse code modulated (PCM) signal to a pulse width modulated (PWM) signal using a lookup table referenced by the data in the PCM signal; and
  means for amplifying the PWM signal to produce an amplified signal.

16. The driver of claim 15, further comprising:
means for filtering the amplified signal to produce an output signal.

17. The driver of claim 15, wherein the converting means comprises a noise-shaping modulator and a pulse width modulator, wherein the noise-shaping modulator outputs an N-bit PCM signal, and wherein the pulse width modulator uses the lookup table to convert the PCM signal to the PWM signal operating at frequency N times greater than a frequency of the noise-shaping modulator.

18. The driver of claim 17, wherein the noise-shaping modulator is a third order sigma delta modulator.

19. The driver of claim 17, wherein the lookup table has a symmetrical structure.

20. The driver of claim 15, wherein the amplifying means further comprises a closed-loop compensation stage including an integrator, a comparator and an attenuator.

* * * * *